United States Patent [19]

Shorthouse

[11] Patent Number: 5,173,457
[45] Date of Patent: Dec. 22, 1992

[54] PASTE COMPOSITIONS

[75] Inventor: Gary P. Shorthouse, Reading, United Kingdom

[73] Assignee: Johnson Matthey Public Limited Company, United Kingdom

[21] Appl. No.: 614,128

[22] Filed: Nov. 16, 1990

[30] Foreign Application Priority Data

Nov. 22, 1989 [GB] United Kingdom ................ 8926383
Feb. 23, 1990 [GB] United Kingdom ................ 9004157

[51] Int. Cl.$^5$ ..................... C03C 3/089; C03C 3/091
[52] U.S. Cl. ........................... 501/65; 501/66; 501/12; 501/20
[58] Field of Search ............. 501/12, 20, 21, 65, 501/66; 522/83; 430/286

[56] References Cited

U.S. PATENT DOCUMENTS

| | | | |
|---|---|---|---|
| 4,030,938 | 6/1977 | Thomas | 501/65 |
| 4,613,560 | 9/1986 | Dueber et al. | 430/286 |
| 4,820,661 | 4/1989 | Nair | 501/79 |
| 4,849,379 | 7/1989 | McCormick | 501/20 |

FOREIGN PATENT DOCUMENTS 0186163 7/1986 European Pat. Off.
0253341 1/1988 European Pat. Off.

Primary Examiner—Karl Group
Assistant Examiner—Chris Gallo
Attorney, Agent, or Firm—Stevens, Davis, Miller & Mosher

[57] ABSTRACT

A thick film dielectric paste for giving fine lines and vias comprises a low permittivity borosilicate or aluminoborosilicate dielectric material of particle size less than 5 μm, together with a medium. The dielectric material sinters at from 600° C. to 1100° C. and is preferably made by sol-gel techniques. Relatively low sintering temperatures can be combined with low permittivity.

9 Claims, No Drawings

PASTE COMPOSITIONS

The present invention concerns improved paste compositions, more especially it concerns improved thick film pastes for electronics applications.

Thick film technology has been used for many years to provide multilayer interconnection of electrical circuit components. The technology uses screen printing and high temperature firing at temperatures generally ranging from 600° C. to 1000° C. to provide successive conductor and dielectric layers, with conductor layers being connected through holes (vias) provided in the dielectric. The density of circuitry that can be obtained by this process is limited by the fineness of the conductor lines that can be produced along with the size of holes (vias) that can be formed in the dielectric. In high speed circuitry, deleterious electrical interactions (cross-talk) can occur between conductor lines. It is desirable to minimise cross-talk by both reducing the width and or length of the conductor lines and by decreasing the relative permittivity (hereinafter referred to for convenience merely as permittivity) of the dielectric.

It is an aim of the present invention to meet the hitherto unsatisfied demand for a thick film dielectric that combines very low permittivity with the ability to provide very small interconnection holes.

Thick film dielectrics are normally composed of a glass of low softening point such as a lead borosilicate, along with a filler that is partially dissolved in the glass during firing and serves to raise its softening point so that the material does not re-soften on re-fire. Glass ceramic materials may also be used. These crystallise during firing in such a way that the recrystallised material has a higher softening point than the parent glass and consequently re-softening on re-fire is avoided. These materials suffer from the problem that to achieve these properties high density and or highly polar materials such as lead and alkali metals must be used. The use of such materials has a considerable bearing on the electrical permittivity of the dielectric which is a function of both the density and polarisability of the insulator. Typically, permittivity values for fired multilayer thick film dielectrics are between 8 and 11. A number of low permittivity materials are available, such as silica or the borosilicates, however the softening points of these materials in their standard form are far too high to be usefully used as thick film dielectrics.

It is known from U.S. Pat. No. 4,613,560 (equivalent to EPO 186163) to utilise a photosensitive medium in combination with ceramic solids and an inorganic binder. The ceramic solid is a dielectric solid such as alumina, titanates, zirconates and stannates, and the inorganic binder may be a glass frit, prepared in conventional way by forming a glass melt, quenching it in water and grinding. The materials disclosed in this USP do not yield, when used as a thick film paste, a very low permittivity together with an ability to form very small interconnection holes, and would find no place in commercial thick film dielectric pastes.

We have now discovered thick film paste compositions which, at least in their preferred embodiments, offer hitherto unrealisable properties. In particular, of less than 50 microns diameter can be provided. References to the diameter of a via herein are to the minimum width of the via, whether the via is circular or not.

The present invention provides a thick film paste composition consisting essentially of a thick film medium component and a dielectric component of substantially spherical particles of dielectric material having a particle size below 5 μm, which particles are sinterable at a temperature in the range of 600° C. to 1100° C. Particle sizes specified herein are as measured by scanning electron microscopy. The paste may also contain additional components providing that these contribute beneficial properties or do not adversely affect desirable properties. In particular, the composition may contain prepolymers, solvents, surfactants and/or rheology modifiers. In one embodiment, the medium component is photohardenable and thus the paste is photosensitive.

The thick film medium component is suitably of known type and generally comprises a resin component which burns off, or depolymerises and the products evaporate or burn off, under the firing conditions used, which resin is dissolved in an organic solvent. The medium also generally comprises thixotropes and wetting agents, and is formulated to maintain the dielectric material in suspension and to permit printing eg by screen printing. The rheological properties, which are determined by the amount and nature of the solids content in combination with the medium, should permit the printing of layers of paste containing vias of the desired size while not forming pin-holes in the printed film. If the vias are to be formed at the same time, the rheology has to be such as to allow this to occur—such vias may be as small as 100 microns. It is an advantage of employing a photohardenable medium, however, that the vias can be formed later and hence the rheological constraints are easier.

In the thick film medium, examples of suitable resins include especially ethyl cellulose, and also phenolics and alkylpolymethacrylates, and suitable solvents include Cellusolve (Trade Mark), butyl carbitols, higher alcohols and esters. Typical thixotropes and surfactants include terpineol and nonyl phenoxypolyoxyethylene glycol, respectively. The actual components of the medium which are selected are not critical and it is to be expected that the specific components and their quantities will be optimised for the requirements of each product paste and its use conditions. The ratio of solids to medium may generally vary from 40–90 wt % solids to 60 to 10% wt medium.

The medium component, when photohardenable, preferably comprises a substantially fully polymerised thermoplastic resin, a radiation-curable diluent and photoinitiator. Such media are disclosed in the context of printing inks in our European Patent No. 106,628, the teaching of which is incorporated herein by reference. In such preferred photohardenable components, the thermoplastic resin is desirably an acrylic resin that acts as a binder until exposed to firing, whereupon it depolymerises to its parent monomers. Copolymers of butyl methacrylate and methyl methacrylate are especially suitable. The radiation curable diluent may be a difunctional monomer such as n-vinyl pyrrolidone. Suitable photoiniators include isopropyl thioxanthone used together with hydrogen donor, for example the amines ethyl-4-dimethylamine benzoate and 2-(dimethylamine)ethyl benzoate. Other photohardenable or photo-sensitive media may be used, and we have used, for example, a commercial positive photoresist. The medium component may include a solvent or extender, and alpha-terpineol is preferred, and, as is conventional in thick film pastes, one or more surfactants to aid mixing and to maintain the dielectric component in suspension, and rheology modifying additives to give desired rheology for processing and printing. A pre-polymer such as "Actocryl 200" (Trade Mark), is preferably used to improve hardening of the photohardened printed film.

The dielectric component is preferably a powder of such particle size and shape that its scattering of light is minimised and such that its particle size is considerably less than the smallest dimension of the vias to be resolved. The component desirably comprises particles in the size range from 0.1 to 3 μm. Preferably the size range is tightly controlled with essentially no particles outside the range, in other words, a monodisperse powder. Most preferably, a particle size of approximately 2 μm is used. Preferably, the particles are not hollow. It has been found that a particularly suitable dielectric component is produced by sol-gel techniques, and such materials offer unexpected advantages in that dielectric materials which are not normally sinterable at temperatures in the range of 600° C. to 1100° C., that is the temperatures normally met with in existing thick film firing technology, become accessible. Thus, materials of especially low permittivity, below 5, may be used. The materials may be a glass containing one or more of the oxides of silicon, boron, aluminium, phosphorus, magnesium and optionally lithium. High atomic number elements, and sodium, should be avoided. It is possible to select materials which have desirable permittivity characteristics, by routine experiment. Preferred dielectric materials comprise borosilicates, with the atomic ratio of boron to silicon being variable from 1:20 to 1:1, or aluminoborosilicates, in which aluminium replaces part of the silicon in a typical borosilicate composition. Such preferred dielectric materials have been found to have permittivities as low as 3.7. These preferred materials can consist of the borosilicate or aluminosilicate or can contain it in admixture with other dielectric materials. For example, a mixture of the borosilicate and pure silica (which silica is of particle size about 0.7 micron) which has been pre-shrunk by high temperature processing can be employed; such a mixture can reduce the shrinking encountered on firing the paste compared to employing the borosilicate alone.

The preparation of monodisperse spheroids or spheres by sol-gel techniques is known. Stoeber et al, J Colloid and Interface Science, 26 (1968) describes the preparation of silica microspheres. Techniques usable in the present in the present invention involve the hydrolysis of a mixture of the appropriate alkoxides to form a sol. A sol-gel may be prepared by an appropriate temperature and time regime. The sol or a sol-gel which is re-dispersed in water is spray in conventional manner to give the desired particles. The particles lose volatile material on heating to about 150° C. Heating to about 350° C. causes the particles to lose organic materials and to form significant porosity, the pore diameters being in the region of 4 to 10 angstrom (0.4 to 1 nanometres). Further heating to temperatures in the range 600° to 1100° C. causes the particle porosity to decrease substantially and the individual particles to coalesce to form a glass or ceramic material.

The sol-gel preparative route provides a desirable particle size which yield the aforementioned benefit in that sintering temperatures of desirable materials are lowered into the range which does not require changes in thick film firing furnaces or firing procedures. Additionally, the small particle sizes achievable, and small range of particle sizes, enables well defined fine vias, typically of 10 to 50 μm in diameter, when a photohardenable medium is used, to be produced using conventional thick film technology, although vias of sizes down to 5 μm have been produced in laboratory tests.

A thick film paste according to the invention may be prepared from the components by a variety of techniques. The proportion of inorganic dielectric component of medium component is suitably in the range 90:10 to 40:60, and suitably for photosensitive pastes in the range 80:20 to 50:50, by weight. Mixing of the components may be facilitated by the use of a surface active agent, which may be selected from a large range of known materials. Mixing may be carried out by stirring or triple roll milling, although other methods may be used. In the case of a photosensitive paste, it is desirable to avoid exposing the medium component prior to, during or subsequent to the mixing operation, to any light in the ultra-violet region of the spectrum.

After formulation of the paste, it may be applied as a thick film to a substrate which may be a conducting or insulating material or a composite substrate having layers of conducting and insulating materials. Application of the thick film may be by screen printing, doctor blading, spinning, dipping or any other method which permits a thin even coat of the material to be deposited on the substrate. The paste may be thinned before use to a desirable viscosity, by the addition of a small amount of solvent, for example amyl acetate. As is well known, a stencil or similar screen may be used to restrict application of the paste to certain areas of the substrate during screen printing.

After application of the thick film paste to the substrate, it is generally left for a short period of time, during which some slumping occurs and mesh marks from screen printing are considerably reduced. The paste is then generally conventionally dried in a belt furnace or an oven, suitably at temperatures of from 50° to 150° C., generally from 70° to 150° C., preferably from 70° to 120° C., (for instance for 10 minutes) before being fired, typically in a belt furnace using peak firing temperatures in the range 850° to 1000° C.

For photosensitive pastes, after application of the paste to the substrate, it is then dried by storing at ambient temperature or by using heat to increase the drying rate. When the paste is sufficiently dry, the substrate is masked in conventional manner so that only those regions of the layer which are required to remain in place are exposed to actinic radiation, in the ultra-violet region of the spectrum, for a period predetermined by the characteristics of the photohardening medium, the thickness of the layer, the type of equipment being used and the intensity of the incident radiation. Advantageously, a contact or projection mask aligner is employed. Preferably a projection mask aligner and a collimated ultra-violet light source are employed, as wear to the photomask and the danger of damaging the applied layer are avoided. As a guide to the exposure time, for an applied layer 22 microns thick with an 8 cm by 8 cm area subjected to the radiation from a 300 watt mercury vapour lamp, an exposure time of approximately 10 seconds can be employed. Treatment of the substrate with a chemical developer, in manner known per se, removes the unexposed regions of the paste. The unexposed regions can be removed for instance by spraying with the developer, for instance ethyl acetate, using a hand held spray gun or an automatic spray developer. This stage can take for instance 15 seconds per substrate. The stage can be carried out in an ultrasonic tank containing the developer, so that the ultrasonic agitation facilitates the removal. Firing of the substrate can be accomplished in conventional manner, typically but not necessarily in a conveyer belt furnace with a peak firing temperature which is generally in the range from 700° to 1000° C., preferably from 900° to 950° C. Depending on the particular furnace and air flow conditions, it can be advantageous to employ a short dwell time at about 400° C. to ensure good burn out of the vehicle.

The actual substrate used is not critical and may be any substrate conventionally used for the purpose.

The present dielectric layer enables vias generally of from 10 to 250 microns, preferably from 10 to 100 microns, especially from 10 to 50 microns, diameter to be obtained. The layer preferably has a permittivity of about 4. It can provide a suitable permittivity without the necessity to incorporate air, as is necessary with some other dielectric materials.

The invention is illustrated by the following Examples.

EXAMPLE 1

Tetraethylorthosilicate (2 moles) is mixed with ethan-1-ol (10 moles) and to this is added 12 moles of water containing a small quantity of hydrochloric acid. The mixture is heated under a reflux condenser for one hour and then tributylborate (1 mole) is slowly added. The mixture is further heated for one hour. After this time, the solution is mixed with 500 mls in an open beaker. The resulting solution is heated to its boiling point with stirring and an additional 250 ml of water is added. The volume of solution is reduced by boiling. Further additions of water followed by volume reduction may be carried out to reduce the alcohol concentration. The beaker is then partially covered and maintained in a vacuum over at 50° C. and at 800 mbar pressure for 18 hours during which time an opalescent gel is formed. The gel is added to 3 liters of water and is dispersed using a Silverson shearer or similar instrument for approximately 1 hour. The temperature of the mixture is maintained at a relatively low level by the use of an ice jacket. The dispersed gel is then immediately spray dried at elevated temperature and pressure. The resulting powder is then heated to 150° C. for one hour during which time further drying occurs. Following this the powder is heated to between 400° and 600° C. to yield the required powder.

The resulting powder is a borosilicate of approximate composition 20% boron and 80% silicon, as oxides, and having a particle size in the range of 0.1 to 5 μm.

Samples of the borosilicate powder were mixed with a photosensitive medium in the proportion 70 wt % powder with 30 wt % of medium. The medium was blended from the following:

|  | wt % |
|---|---|
| Tripropyleneglycoldiacrylate | 84.1 |
| Isopropyl thioxanthone | 1.2 |
| Ethyl-4-dimethylamine benzoate | 3.5 |
| alpha-terpineol | 6.5 |
| butyl methacrylate | 3.4 |
| methyl methacrylate | 1.3 |

The mixture was then passed through a triple roll mill for 3 to 5 passes. The resulting mixture was diluted with 5 wt % of amyl acetate, then printed by means of a laboratory thick screen printer using screens of from 200 to 400 mesh, onto a conventional substrate. The printed substrate was exposed in a mask aligner using a 300 watt mercury vapour lamp, with exposure times of from 2 to 30 seconds. The substrate carrying the paste layer was developed by spraying with ethyl acetate, to remove unhardened paste. Amyl acetate may be preferred as a developing agent. The substrate carrying the printed and hardened paste pattern, corresponding to the mask, was fired by passing through a belt furnace with a typical 60 minute "bell" temperature profile, with a peak temperature of 950° C., which was maintained for 10 minutes. The resulting fired dielectric material had permittivities in the range 4 to 8, and could form vias of from 10 to 250 microns, preferably 10 to 50 microns diameter, for instance 50 microns and 100 microns.

EXAMPLES 2-4

The dielectric material of the invention, for instance that described in Example 1, is used to form multi-layer systems. Several different conductor systems utilising gold are used to print onto a conventional alumina substrate; the dielectric material is then printed onto the conductor, masked, exposed to UV light and developed as previously described. The process is repeated to build up a test multi-layer, which is fired and then the properties of the dielectric are measured. For the conductor system "Etchable Thick Film", a commercial gold powder etchable thick film conductor paste is used, similarly, conventional commercial technology is used to deposit gold from "Metallo-Organics" and from a "Conventional printing Thick Film". The properties of the dielectric are shown below in Tables 1 to 3 for the different gold conductor systems.

TABLE 1

| ETCHABLE THICK FILM | |
|---|---|
| Line and space resolution | 20 microns |
| Fired Thickness | 3-4 microns |
| Resistivity | 0.0036 ohms at 10 microns |
| Vias size | <50 microns |
| Permittivity | 4 |
| Dielectric Thickness | 15 microns per layer |

TABLE 2

| METALLO-ORGANICS | |
|---|---|
| Line and space resolution | 15 microns |
| Fired Thickness | 0.2 microns |
| Resistivity (plated with copper) | 0.0015 ohms/square |
| Vias size | <50 microns |
| Permittivity | 4 |
| Dielectric Thickness | 15 microns per layer |

TABLE 3

| CONVENTIONAL PRINTING THICK FILM | |
|---|---|
| Line and space resolution | 50 microns |
| Fired Thickness | 7 microns |
| Resistivity | 0.0036 ohms/square at 10 microns |
| Vias size | <50 microns |
| Permittivity | 4 |
| Dielectric Thickness | 15 microns per layer |

The present invention as described above may be modified in ways available to those skilled in the art without departing from the general scope. It will be readily appreciated that the invention includes a method of forming a dielectric layer on a substrate, comprising depositing a coating on said substrate of a paste according to the invention, and firing the substrate and paste to cause the dielectric component of the paste to fuse or sinter. In the case of the photosensitive paste, the method also comprises exposing a portion of said deposited paste to actinic radiation so as to cause it to harden, removing the unhardened paste portion and firing the substrate and remaining paste portion to cause the dielectric component of the paste to fuse or sinter.

The invention further provides a substrate carrying a dielectric layer which is a fired layer of the paste according to the invention. The invention additionally provides a thick film circuit comprising a dielectric layer which is a fired layer of the paste according to the invention.

EXAMPLE 5

The inorganic particles as described in Example 1 are mixed, e.g. in a roll mill, with a conventional thick paste organic medium. The proportions of the components may be varied quite considerably, but are conveniently in the amounts of 40 to 80 wt % of particles and 60 to 20 wt % of medium. The medium is conventional, and comprises resin such as ethyl cellulose (although other resins such as ethylhydroxyethyl cellulose, wood rosin, phenolic resins and mixtures thereof with ethyl cellulose, polymethacrylates of lower alcohols may also be used) and a solvent such as high boiling alcohols and their esters, dibutyl-phthalate, butyl carbitol acetate and Texanol (Trade Mark). Wetting agents and thixotropes are also usually included. A screen printable paste is producted by mixing a medium consisting of ethyl cellulose, Texanol solvent and a phosphate ester wetting agent in a ratio of 5:90:5 by weight, and dielectric particles as described in Example 1, in a 25:75 weight ratio.

I claim:

1. A thick film paste composition comprising a thick film medium component and a dielectric component of substantially spherical particles of dielectric material having a particle size below 5 μm, and which particles are sinterable at a temperature in the range of 600° C. to 1100° C., said particles of dielectric material being prepared by a sol-gel process, with the proviso that the composition contains neither sodium nor lithium high atomic number elements.

2. A thick film paste as claimed in claim 1, wherein the dielectric material has a permittivity below 5.

3. A thick film paste as claimed in claim 1, wherein the dielectric material is a borosilicate or aluminoborosilicate.

4. A thick film paste as claimed in claim 1, wherein the dielectric material has a particle size in the range of 0.1 to 3 μm.

5. A thick film paste as claimed in claim 1, wherein the composition also contains a filler.

6. A thick film paste as claimed in claim 1, wherein the medium component is a photohardenable medium.

7. A thick film paste as claimed in claim 6, wherein the photohardenable medium comprises substantially fully polymerised thermoplastic resin, an actinic radiation-curable diluent and a photoinitiator.

8. A method of forming a dielectric layer on a substrate, by depositing a coating of a thick film paste onto the substrate and firing the substrate carrying said thick film paste, wherein the thick film paste is according to claim 1.

9. A method as claimed in claim 8, wherein the firing is carried out at a temperature from 600° C. to 1100° C.

* * * * *